US006471832B1

(12) United States Patent
Nakayama et al.

(10) Patent No.: US 6,471,832 B1
(45) Date of Patent: Oct. 29, 2002

(54) METHOD OF PRODUCING PROTECTED THERMAL HEAD

(75) Inventors: Masatoshi Nakayama; Masahiro Nakano; Tsukimi Endo, all of Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 08/641,855

(22) Filed: May 2, 1996

Related U.S. Application Data

(62) Division of application No. 08/149,440, filed on Nov. 9, 1993, now Pat. No. 5,557,313.

(30) Foreign Application Priority Data

Nov. 12, 1992 (JP) ........................................ 9-326202

(51) Int. Cl.[7] ........................................ C23C 14/34

(52) U.S. Cl. ........................ 204/192.16; 204/192.12; 204/192.15; 204/192.23; 204/192.3

(58) Field of Search ........................ 204/192.1, 192.12, 204/192.15, 192.16, 192.23, 192.31

(56) References Cited

U.S. PATENT DOCUMENTS 4,883,574 A * 11/1989 Dos Santos Pereina Ribeiro ........................ 204/192.16
4,973,388 A * 11/1990 Francois et al. ....... 204/192.16
5,062,937 A * 11/1991 Komuro ................ 204/192.16

FOREIGN PATENT DOCUMENTS

| | | |
|---|---|---|
| JP | 57-185174 | 11/1982 |
| JP | 57-185174 A | 11/1982 |
| JP | 2-194628 A | 8/1990 |

OTHER PUBLICATIONS

Office Action from Japanese Counterpart Application 5-303258 Dispatched Dec. 25, 2001.

* cited by examiner

*Primary Examiner*—Rodney G. McDonald
(74) *Attorney, Agent, or Firm*—Akin, Gump, Strauss, Hauer & Feld, L.L.P.

(57) ABSTRACT

A method of producing a wear-resistant protective film for a thermal head comprises depositing a wear-resistant protective film by sputtering on a thermal head which includes a substrate, and a heat-developing layer and a pair of electrodes formed on either the substrate or a heat-regenerative layer formed thereon. A layer of the wear resistant protective film is formed under a RF larger bias and another layer without a bias or with a smaller bias. Good step coverage is obtained by the RF sputter layer of the wear-resistant and the protective film prevents the intrusion of water that can cause cracking, and the layer formed under no or smaller bias reduces internal stresses and inhibits the development of cracks due to internal stresses as well as the cracking by RF sputtering.

9 Claims, 1 Drawing Sheet

METHOD OF PRODUCING PROTECTED THERMAL HEAD

CROSS-REFERENCE TO RELATED APPLICATION

This is a division of Application Ser. No. 08/149,440, filed Nov. 9, 1993, allowed now U.S. Pat. No. 5,557,313.

BACKGROUND OF THE INVENTION

1. Field of the Invention

This invention relates to a wear-resistant protective film for a thermal head and a method of producing a wear-resistant protective film for a thermal head.

2. Prior Art

Thermal heads are extensively used as printing heads for computers, word processors, facsimile machines, etc. The head has a number of dots or resistance heating elements of polysilicon or the like arranged in a matrix and which are selectively supplied with a current to print characters by heat transfer through a printing ribbon onto paper. Since the paper is moved in sliding contact with the thermal head surface, the resistance heating elements must be protected on the surface with a highly wear-resistant protective film.

Each spotlike printing element of the thermal head, as shown in FIG. 1, comprises, from the base upward, a substrate 1 of alumina or the like, a regenerative layer 2 of glaze glass or the like, a heating-element layer 3 of polysilicon or the like, electrodes 4, 5, and a wear-resistant protective film 6. In the figure the numeral 7 designates a heat-developing zone. The protective film 6 generally is required to have high hardness, limited internal stresses attributable to heat, composition and structure, resistance to wear, and stability to moisture, alkalis, acids and the like. Various materials have hitherto been studied, including such known materials of Si—O—N, Si—Ti—O—N, Si—La—O—N, Si—Al—O—N systems.

Wear-resistant protective films conventionally formed by sputtering crack frequently. Once cracked, such a film allows moisture in the atmosphere to gain entrance through the crack into the thermal head to corrode it, often leading to film separation. Among the factors responsible for the cracking are the development by dint of a peening effect of the internal stresses due to heat, composition, and structure, and the lack of toughness. A particularly serious factor is inadequate step coverage of steplike portions. Ideally, the wear-resistant protective film is formed as shown in FIG. 1. In the actual film-forming process the film material fails to cover the steps fully, as at 8, 8 in FIG. 2, giving cause for cracking as early as the formation of the film. Intrusion of water or repeated exposure to heat would invite premature cracking at the steps.

This step coverage problem can be overcome by the use of a biased radio frequency (RF) sputtering technique in forming a wear-resistant protective film (Japanese Patent Application Public Disclosure No. 135261/1988). The biased RF sputtering proves excellent in covering steps, but the attendant peening effect and incorporation of sputter gases (Ar, Kr, etc.) into the protective film increase the internal stresses. Consequently, the film cracks easily and becomes less adherent.

Although the above reference describes that cracks and peeling are avoided, the reality is that cracks are prone to develop due to the internal stress, according to the inventors tests. Moreover, there is no disclosure in the reference on forming two or more layers while varying the bias for sputtering.

The problem to be solved by the invention

As stated above, the conventional wear-resistant protective film is prone to crack or corrode owing to poor step coverage by sputtering. Biased RF sputtering too tends to cause cracking due to increased internal stresses and low adherence.

Means for solving the problem

Therefore, the present invention aims at providing a wear-resistant protective film for a thermal head and a method of producing a wear-resistant protective film which has little possibility of cracking ascribable to internal stresses or step coverage.

The present invention resides in a method for producing a a wear-resistant protective film for a thermal head, which comprises sputtering a wear-resistant protective film on a thermal head which includes a substrate, and a heat-developing layer and a pair of electrodes formed on either the substrate or a heat-regenerative layer formed thereon, characterized in that a part of the wear-resistant protective film is formed under a larger bias and another part under no or a smaller bias. The present invention also resides in the wear-resistant film thusly formed. The bias may be a DC bias or an AC bias for an electrically conductive protective film and an AC bias is used for an electrically insulating protective film, usually, a high frequency bias is preferred.

According to the invention, a layer of good step coverage formed by sputtering under a larger bias( preferably RF) in one part of the wear-resistant protective film prevents the intrusion of water that can cause corrosion and cracking. Also, a layer of low internal stress is formed under no bias or a smaller bias, adjacent to the layer sputtered under the larger bias, the internal stress level throughout the film is reduced. This inhibits development of cracks with the internal stresses produced by sputtering under the larger bias. These factors combine to prevent cracking which otherwise results from the ingress of moisture or internal stresses.

Sputtering with a larger bias is defined as a sputtering (preferably, RF sputtering) under a bias in the range of −50 V and −200 V, more preferably −60 and −120 V. Sputtering with no bias or a smaller bias is defined as a sputtering under zero bias or a bias less than two third, more preferably from one half to one tenth, of the larger bias. If the protective film is electrically conductive, AC or DC voltage bias may be used. If the protective film is an insulator an AC voltage bias is usually used because an AC voltage bias is used for protective film of any electrical properties.

According to the present invention a superior wear-resistant protective film for thermal heads is produced which comprises a material selected from metal oxides, metal nitrides, or mixtures thereof, such as Si—O—N, Si—Ti—O—N, Si—La—O—N, Si—Al—O—N, Si—Sr—O—N, Si—Mg—O—N or mixtures of these materials, having a concentration of sputtering gas varying in the direction of thickness of the protective film. The metals here mean that ordinary metals such as Ti, Al and the like, B in the Group III*a* and C, Ge and Si in Group IV*a,* preferably Si.

The layer or layers formed with no bias or a smaller bias contains the sputtering gas such as Ar or Kr in an amount of 0–3 at % and develops little internal stress and accordingly no crack is observed.

The layer or layers formed with a larger bias contains the sputtering gas in an amount of 2–10 at % (but less than the layer or layers formed with no or smaller bias) and exhibits a good step coverage.

The thickness of the film deposited by the larger bias desirably ranges between 0.1 $\mu$m and 5 $\mu$m, more desirably between 0.5 $\mu$m and 3 $\mu$m. If the film is thinner than 0.1 $\mu$m the step coverage is inadequate, allowing the ingress of moisture. If it is thicker than 51 μm the internal stresses increase to excess.

On the other hand, the thickness of the layer deposited by sputtering with no bias or smaller bias may be preferably the same or larger than that obtained by the radio frequency sputtering.

The term "layers" here does not mean layers of different materials but layers having different concentrations of the sputtering gas obtained by varying the magnitude of the bias. Advantages of the invention The present invention thus makes it possible to produce a wear-resistant protective film which has little possibility of cracking due to internal stresses or step coverage. Use of smaller bias in place of no bias increases the adhesion to the thermal head. This can be explained as follows. The layer formed under no bias and the layer formed under a larger bias create tensile stress and compression stress, respectively, and thus their combination produces a large shearing stress between them. On the other hand, the layer formed under a smaller bias and the layer formed under a larger bias create both compression stresses, respectively, and thus their combination produces a small shearing stress between them. Variation of bias voltage during sputtering is not suggested in the above-cited publication. From the foregoing, a protective film having no crack owing to the internal stress nor crack due to the poor step coverage is provided.

Another advantage of the present invention is the productivity of the protective film since the film having different concentrations of sputtering gas in the direction of the film thickness can be formed by using a single apparatus with a single target to be sputtered.

DETAILED DESCRIPTION OF THE INVENTION

Figure 1:
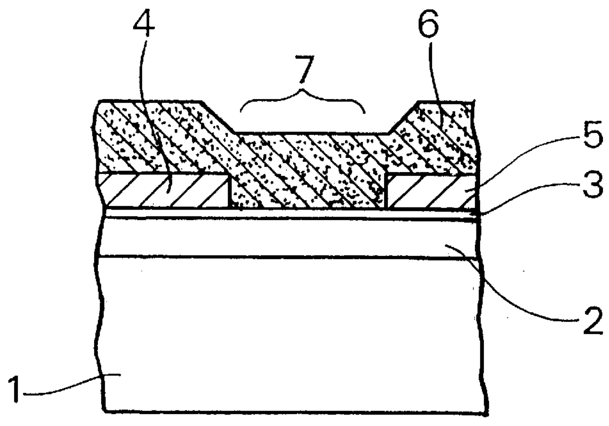
FIG. 1 is a sectional view showing the basic structure of a thermal head.
Figure 2:
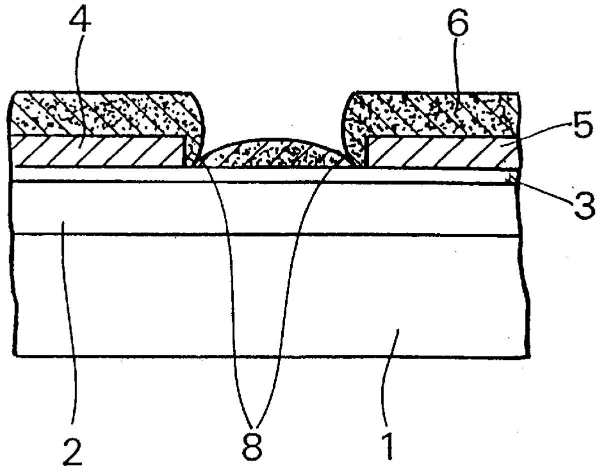
FIG. 2 is a sectional view showing the structure of a conventional thermal head.
Figure 3:
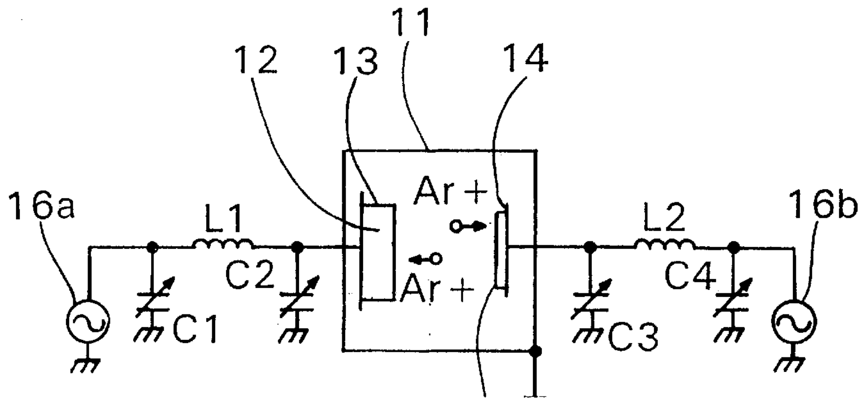
FIG. 3 is a sputtering apparatus used for the present invention.

The method of the invention is carried into practice using a sputtering apparatus illustrated in FIG. 3. The sputtering apparatus includes a hermetically sealed vacuum vessel 11 and a pair of electrodes 13, 14 arranged opposite to each other in spaced relation within the vessel. The electrode 13 supports a sputter source material or target 12, and the electrode 14 a thermal head 15 on which a wear-resistant protective film is to be formed. The electrode 13 is connected with an RF generator 16*a*, and the electrode 14 is connectable with an RF generator 16*b*. To the line extending from the RF generator 16*a* to the electrode 13 are connected a coil L1 in series and variable capacitors C1, C2 in parallel. The line extending from the RF generator 16*b* the electrode 14 are connected with a coil L7 and variable capacitors C3, C4.

An RF bias can be applied at will to the thermal head 15 by turning on or off a switch 17.

The method of the invention is put into practice using the afore-described apparatus in the following way. First, a target 12 is attached to the electrode 13 and a thermal head 15 to the electrode 14. The vessel 11 is evacuated and an inert gas, such as Ar or Kr, is introduced to maintain a pressure of several millitorrs. The RF generator 16*a* is switched on. On the other hand, the RF generator 16*b* is switched on only at a desired point of time for a desired duration to apply an RF bias and thereby control the locations of lamination and thickness of the layer deposited by RF sputtering. By switching off the RF generator 16*b*, a zero bias is obtained or by attenuating the output voltage of the RF generator 16*b* a smaller bias can be obtained.

Concrete examples of the invention will now be explained.

Example 1

Powders of $SiO_2$ and $Si_3N_4$ were mixed at a molar ratio of 5:5, the mixture was compressed to a target, and the target subjected to RF sputtering with a power of 4 kW supplied to the electrode 13, at an Ar pressure of 10 mtorrs, with a biased RF voltage of −100 V applied to the electrode 14, and at a substrate temperature of 400° C. The Ar gas was mixed $O_2$ and $N_2$ as desired to adjust the composition.

An under layer 7 μm thick was formed by unbiased sputtering and a top layer 1 μm thick by biased RF sputtering.

The internal stress, durability, gas contents, and defect frequency of the Si—O—N film thus obtained were measured. The results are given in Table 1. The durability was determined in terms of the number of A4-size copies that could be printed by sublimation color printing. The defect frequency was determined by the number of samples that showed any clear defect in five samples tested.

Example 2

The procedure of Example 1 was repeated with the exception that both the top and under layers were deposited by unbiased sputtering to a thickness of 3 μm each and an intermediate layer 2 μm thick was formed by RF bias sputtering. Table 1 shows the results.

Example 3

In the procedure of Example 1, the sputtering gas was replaced with Kr and the under layer was deposited by RF larger bias sputtering to be 1 μm thick and the top layer by unbiased sputtering to be 6.5 μm thick. Table 1 shows the results.

Comparative Example 1

In Example 1, the two layers were replaced by a single layer 8 μm thick formed by the RF larger bias sputtering. Table 1 shows the results.

Comparative Example 2

In Example 1, an 8 μm thick layer was formed instead by unbiased sputtering. Table 1 shows the results.

Example 4

In the procedure of Example 1, the top layer was deposited by RF larger bias(−100 V) sputtering to be 1.5 μm thick using Ar as the sputtering gas and the under layer by smaller bias(−20 V) sputtering using the same RF frequency to be 6 μm thick. Table 1 shows the results.

Example 5

In the procedure of Example 4, the lower layer of a thickness of 6 μm was formed by sputtering under RF smaller bias(−10 V) and then the bias voltage was continuously varied to −100 V( at a rate of −3 V/min.) and the upper layer of a thickness of 1.5 μm was formed by sputtering under RF larger bias( −100 V). Table 1 shows the results.

Example 6

In the procedure of Example 1, the sputtering gas was replaced with Kr and the upper layer was deposited by RF larger bias(−100 V) sputtering to be 1.5 μm thick and the lower layer by smaller biased(−10 V) sputtering using the same RF frequency to be 6 μm thick. Table 1 shows the results.

TABLE 1

| | | Durability | Defect freq. No. of | Sputtering gas in layers (at %) | |
|---|---|---|---|---|---|
| Examples | Internal stress dyne/cm$^2$ | No. of copies printed | defect sample in 5 samples | With larger bias | With smaller or no bias |
| Ex. 1 | 9 × 10$^8$ # | 20000 | 0 | Ar 5.5 | Ar 0.05 |
| Ex. 2 | 8.5 × 10$^8$ # | 20000 | 0 | Ar 5.3 | Ar 0.03 |
| Ex. 3 | 9 × 10$^8$ # | 20000 | 0 | Kr 6.2 | Kr 0.08 |
| Ex. 4 | 1.5 × 10$^9$ # | >30000 | 0 | Ar 5.4 | Ar 1.5 |
| Ex. 5 | 1.6 × 10$^9$ # | >30000 | 0 | Ar 5.3 | Ar 1.5 |
| Ex. 6 | 1.0 × 10$^9$ # | >30000 | 0 | Kr 6.1 | Kr 1.0 |
| C.Ex.1 | 8 × 10$^9$ # | 10000 | 1 | Ar 5.5 | — |
| C.Ex.2 | 8 × 10$^8$ ★ | 10000 | 5 | — | Ar 0.05 |

Note: # is compression and ★ is tensile stress.

As will be apparent from the examples, the wear-resistant protective films formed in accordance with the invention for thermal heads have lower internal stresses and are more durable than conventional protective films.

For one thing, a layer of good step coverage formed by RF sputtering in one part or another of the wear-resistant protective film prevents the intrusion of water that can cause cracking, and for another, a layer of low internal stresses formed adjacent to the RF sputtered layer inhibits the development of cracks due to internal stresses as well as the cracking by RF sputtering. Thus, both the ingress of moisture and cracking owing to internal stresses are avoided.

The combination of the layer formed by sputtering under smaller bias and the layer formed by sputtering under RF larger bias is the most durable wear-resistant protective film for thermal head.

Yet further advantage of the present invention is that the process is simplified since a single target and a single sputtering apparatus may be used to perform the process while appropriately controlling the bias voltage and thus the productivity is high.

What is claimed is:

1. A method of producing a protected thermal head for use in sliding contact printing applications, comprising the steps of:

preparing a thermal head comprising a substrate, a heat generating layer on the substrate and a pair of electrodes on said heat generating layer; and depositing, by sputtering, a wear-resistant protective film comprising Si, O and N on said thermal head in a sputtering gas, wherein said wear-resistant protective film is formed by sputtering at least one first layer under no bias or a first bias and at least one second layer under a larger bias than said no or first bias used to form said first layer, wherein a voltage of said larger bias is in a range between −5 V and −200 V and a voltage of said no or said first bias is in a range of from 0 to ⅔ of said voltage of said larger bias.

2. A method of producing a protected thermal head according to claim 1, wherein said first layer comprises a concentration of said sputtering gas of 0–3 at %.

3. A method of producing a protected thermal head according to claim 2, wherein said second layer comprises a concentration of said sputtering gas of 2–10 at % and larger than said concentration of the sputtering gas in said first layer.

4. A method of producing a protected thermal head according to claim 3, wherein said second layer has a thickness of 0.1–5 μm.

5. A method of producing a protected thermal head according to claim 1, wherein said voltage of said larger bias is in a range from −60 V to −120 V, and said voltage of said no or said first bias is in a range from 1/10–1/2times said voltage of said larger bias.

6. A method of producing a protected thermal head according to claim 1, wherein a magnitude of each said bias is continuously varied during the sputtering.

7. A method of producing a protected thermal head for use in sliding contact printing applications, comprising the steps of:

preparing a thermal head comprising a substrate, a heat generating layer on the substrate and a pair of electrodes on said heat generating layer; and depositing, by sputtering, a wear-resistant protective film comprising Si, O and N on said thermal head in a sputtering gas, wherein said wear-resistant protective film is formed by sputtering at least one first layer under no bias or a first bias and at least one second layer under a larger bias than said no or first bias used to form said first layer, wherein said first layer comprises a concentration of said sputtering gas of 0–3 at % and wherein a voltage of said larger bias is in a range between −50 V and −200 V and a voltage of said no or said first bias is in a range of from 0 to ⅔ of said voltage of said larger bias.

8. A method of producing a protected thermal head for use in sliding contact printing applications, comprising the steps of:

preparing a thermal head comprising a substrate, a heat generating layer on the substrate and a pair of electrodes on said heat generating layer, and depositing, by sputtering, a wear-resistant protective film comprising Si, O and N on said thermal head in a sputtering gas to form a protected thermal head for use in sliding contact printing applications, wherein said wear-resistant protective film is formed by sputtering at least one first layer under no bias or a first bias and at least one second layer under a larger bias than said no or first bias used to form said first layer, wherein said wear-resistant protective film has a thickness of at least 1.0 μm and wherein a voltage of said larger bias is in a range between −50 V and −200 V and a voltage of said no or said first bias is in a range of from 0 to ⅔ of said voltage of said larger bias.

9. The method of producing a protected thermal head according to claim 8, wherein said first layer comprises a concentration of said sputtering gas of 0–3 at %.

* * * * *

UNITED STATES PATENT AND TRADEMARK OFFICE

CERTIFICATE OF CORRECTION

PATENT NO. : 6,471,832 B1
DATED : October 29, 2002
INVENTOR(S) : Nakayama et al.

It is certified that error appears in the above-identified patent and that said Letters Patent is hereby corrected as shown below:

Title page,
Insert -- [*] Notice: Under 35 U.S.C. 154(b), the term of this patent shall be extended for 1,135 days. --.

Signed and Sealed this

Twenty-first Day of January, 2003

JAMES E. ROGAN
*Director of the United States Patent and Trademark Office*